Figure 1:
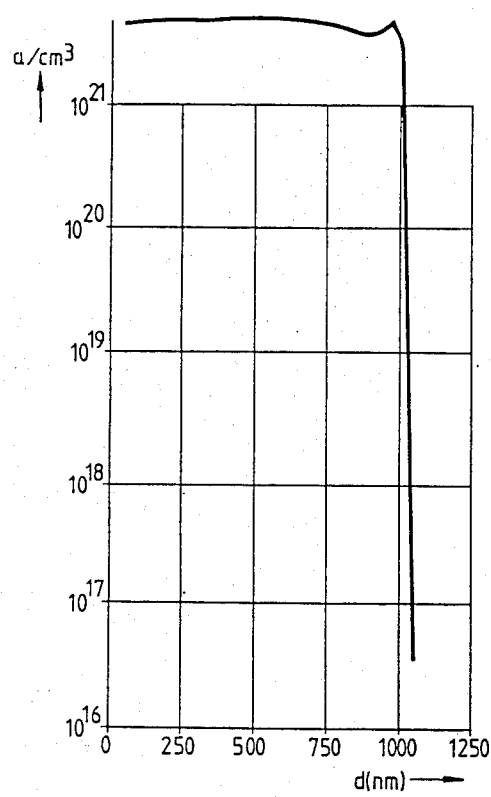

United States Patent [19]

Foxon

[11] Patent Number: 4,640,720
[45] Date of Patent: Feb. 3, 1987

[54] METHOD OF MANUFACTURING A SEMICONDUCTOR DEVICE

[75] Inventor: Charles T. Foxon, Crawley, England

[73] Assignee: U.S. Philips Corporation, New York, N.Y.

[21] Appl. No.: 725,888

[22] Filed: Apr. 22, 1985

[30] Foreign Application Priority Data

May 14, 1984 [GB] United Kingdom ................. 8412275

[51] Int. Cl.⁴ .................. H01L 21/203; H01L 21/302
[52] U.S. Cl. ..................................... 148/175; 118/720; 118/726; 148/DIG. 6; 148/DIG. 169; 156/612; 156/DIG. 103
[58] Field of Search ....... 148/175, DIG. 169, DIG. 6; 156/612, DIG. 103; 118/720, 726

[56] References Cited

U.S. PATENT DOCUMENTS

| | | | |
|---|---|---|---|
| 3,127,226 | 3/1964 | Rector | 148/DIG. 169 |
| 3,303,067 | 2/1967 | Haering et al. | 148/DIG. 169 |
| 3,531,335 | 9/1970 | Heyerdahl et al. | 148/DIG. 169 |
| 4,159,919 | 7/1979 | McFee et al. | 148/175 |
| 4,160,166 | 7/1979 | Etienne et al. | 148/175 X |
| 4,426,569 | 1/1984 | Miller et al. | 156/DIG. 103 |

FOREIGN PATENT DOCUMENTS 0054696 3/1984 Japan ................. 156/DIG. 103

OTHER PUBLICATIONS

Chang et al., "Fabrication of Multilayer Semiconductor Devices", I.B.M. Tech. Discl. Bull., vol. 15, No. 2, Jul. 1972, pp. 365–366.

Primary Examiner—William G. Saba
Attorney, Agent, or Firm—Paul R. Miller

[57] ABSTRACT

A method of manufacturing a semiconductor device, in which method a plurality of epitaxial layers are deposited by molecular beam epitaxy. A significant problem in such a method is the variation in the flux emitted by an effusion cell after the shutter associated with that cell has been opened, this resulting in undesired variations in the composition in the thickness direction of the epitaxial layer being grown. In a method according to the invention, when the shutter of a molecular beam source is opened, the rate of input of heat to that source is increased by a predetermined value so that the temperature of that source does not change substantially as a result of the opening of that shutter, and when the shutter is closed the rate of input of heat to that source is reduced by the predetermined value.

5 Claims, 4 Drawing Figures

METHOD OF MANUFACTURING A SEMICONDUCTOR DEVICE

The invention relates to a method of manufacturing a semiconductor device, the method comprising the steps of providing a monocrystalline substrate in a deposition chamber of a molecular beam epitaxy apparatus, reducing pressure in the deposition chamber to below atmospheric pressure, heating the substrate and causing a plurality of successive combinations of molecular beams to be incident on the substrate so as to form a plurality of epitaxial layers, wherein the molecular beams each comprise a constituent element of the respective layer material and each beam emanates from a separate source when a shutter associated with the respective source has been opened. Such a method may be used, for example, for manufacturing laser diodes, field effect transistors and microwave diodes.

In a molecular beam process, fluxes of the constituent elements of the epitaxial layer are generated in sources (effusion cells), separate sources being generally used for each element. The composition of the epitaxial layer depends on the magnitudes of the fluxes of the constituent elements of the layer, and the magnitude of each flux depends upon the temperature of the respective source. In order to maintain each flux at a preset value, it is necessary to maintain the temperature of each source at a respective predetermined temperature. When a temperature equilibrium for a source has been established, the heating provided by an associated heating controller will exactly balance the rate at which heat is lost by the source to the surroundings of the source. A further function of the heating controller is to make any adjustments to the heat input of the source as rapidly as possible consistent with maintaining stable operation whenever the temperature of the source varies from the predetermined temperature of that source.

Simple on-off control systems in which the heater power is either fully on—when the source temperature is below the predetermined temperature—or off, when the source temperature is above the predetermined temperature, do not provide sufficiently accurate control of the source temperature. Proportional control systems are commonly used to control the power input to the heaters of sources used in molecular beam processes. Such control systems overcome the problem of temperature cycling of the source by enabling there to be continuous variation of the power input to the heater of the source. The heater voltage is a function f of the difference between the measured and desired temperatures of the source, where f is defined by the equation $$f = A(T_s - T_m) + B \int_0^t (T_s - T_m)dt + C\frac{d}{dt}(T_s - T_m)$$

A, B and C are programming constants, and $T_s$ and $T_m$ are the set temperature and the measured temperature respectively. B and C are often expressed as time constants and are sometimes referred to as integral action and differential action time constants respectively. Such control systems, which are known as three-term controllers or P.I.D. controllers (Proportional Action, Integral Action and Derivative Action), provide very accurate temperature control, but the response to changes in temperature is slow, due to the thermal mass of the source. When growing epitaxial structures with abrupt changes in the basic composition or in the doping, rapidly acting mechanical shutters disposed in front of the molecular beam sources are used to start or stop the emanation of molecular beams from the respective sources. The act of opening or closing a shutter in front of a source results in a significant relatively abrupt change in the rate at which heat is lost from the front of the source and hence in a relatively abrupt change in the temperature of that source, and for a source operating at about 1000° C., the time elapsing between the change in position of the shutter and the restoration of the source to its initial temperature before the shutter was moved is typically of the order of 5 to 10 minutes, depending inter alia on the thermal mass of the source. When a shutter is opened, the temperature of the associated source will fall, as a result of the rate of loss of heat from that source increasing, and when a shutter is closed, the temperature of the source increases as a result of heat emitted from the source being reflected by the shutter back into the source. During the investigations which led to the present invention, it was found that when opening or closing a shutter in front of a source, the rate at which heat is lost from that source changes by from about 1 to 3%, depending upon the shape and reflectivity of the shutter which in turn is influenced by material accumulated on the shutter during the process. Most (>95%) of the heat lost from a source is lost by radiation and so the change in the rate of loss of heat resulting from the opening or the closing of a shutter will result in a fall or in a rise in temperature of the order of 5K with a source temperature of 1000K. After peaking to this value, this temperature change will gradually be reduced to zero as the three-term controller adjusts the rate of input of heat to the source in an appropriate manner, but for about 5 minutes the flux emanating from the source will be about 10% lower than the intended flux.

When growing a single layer of gallium arsenide, the effect is not too serious, since the net result will be an initially reduced rate of deposition with possibly a slightly higher doping level (when a dopant is present). The situation is more serious when growing alloy films since the alloy composition will not be constant until the source temperatures have re-attained the predetermined values. When a superlattice structure is grown in a molecular beam epitaxy apparatus in which the heat inputs fed to the sources are controlled by three-term controllers, the effect of the frequent opening and closing of one or more shutters will be to cause the temperature(s) of the source(s) associated with the shutter(s) to oscillate about a mean temperature which is below the desired source temperature, resulting in the composition of the films deposited which contain material from the source(s) whose shutter(s) is(are) being opened and closed repeatedly varying from the desired composition.

The avoidance of changes in the temperature of a source has long been recognised as a significant problem in the molecular beam epitaxy art, but possibly because of the apparent contradiction between the fine degree of accuracy of the temperature control achieved by three-term controllers and the relatively coarse changes (for example, 10%) in the magnitude of the flux emanated from a source after a shutter associated with that source has been closed or opened, there has been acceptance voiced at conferences devoted to molecular beam process technology that this problem was insoluble.

In an article "Optical quality GaInAs grown by molecular beam epitaxy" by G. Wicks et al., in Journal of Electronic Materials, Vol. 11, No. 2, (1982), pages 435 to 440, it is stated that after opening the shutters on individual Ga and In cells, the Ga and In fluxes fell over a period of about 3 minutes to values about 7% and about 2% respectively below the respective initial values. It was considered that the shutters acted as heat shields. While the backs of the cells are maintained at constant temperature by control thermocouples, opening the shutters allows the front of the cells to cool by increased radiation, decreasing the fluxes accordingly. This article states that alloy growth should be initiated by rotating the substrate into the molecular beams only after the shutters had been opened long enough for the cell temperature profile to re-equilibrate. Such a procedure may be detrimental to the properties of the interface due to the adsorption of impurities or the creation of native point defects (vacancies or interstitials).

The object of the invention is to provide a method in which changes in source temperature consequent to the opening or closure of a shutter associated with that source are mitigated.

The method according to the present invention is characterised in that when the shutter of one of the sources is opened the rate of input of heat to that source is increased by a predetermined value so that the temperature of that source does not change as a result of the opening of the shutter, and wherein when the said shutter is closed the rate of input of heat to that source is reduced by the said predetermined value.

The plurality of epitaxial layers may, for example, constitute a superlattice structure. The semiconductor device may be, for example, a double heterojunction laser diode.

In one embodiment of the invention, the heat input to a source is controlled by a four-term controller, in which the fourth term produces the predetermined increase in heat input to the source and is linked to means controlling the opening and closing of the shutter associated with that source.

In another embodiment of the invention, the predetermined increase in heat input to each source and the operation of the respective shutters are controlled by means of a microprocessor or a microcomputer.

It was found when using a method according to the invention, that the source temperature both after the shutter has been opened and after the shutter has been closed is significantly closer to the predetermined temperature than is the case when the rate of input of heat to the source is controlled solely with the aid of temperature-sensing means, for example, when a three-term controller alone is used. The improvement over the prior art systems which is achieved by the method according to the invention is due to the use of a combination of accurate but slow-acting control of a three-term controller or that part of a microcomputer programme which achieves similar temperature-sensed control, and the abruptly acting switching on or off of the predetermined increase of the rate of input of heat.

An embodiment of the invention will be described with reference to an Example and to FIGS. 2 to 4 of the drawings. In the drawings, FIG. 1 is a graph on which the aluminium content a in atoms/cm$^3$ of a $Ga_{1-x}Al_xAs$ layer grown by a MBE process over a GaAs layer on a GaAs substrate is plotted against the depth d (nm) from the surface of the layer, the source temperatures in this process are controlled by a microcomputer using a programme which does not use any shutter-linked heating terms.

Figure 2:
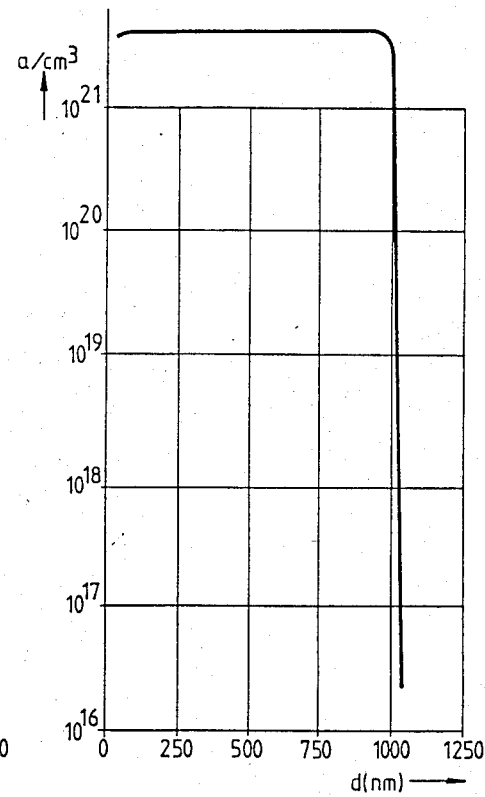
Figure 4:
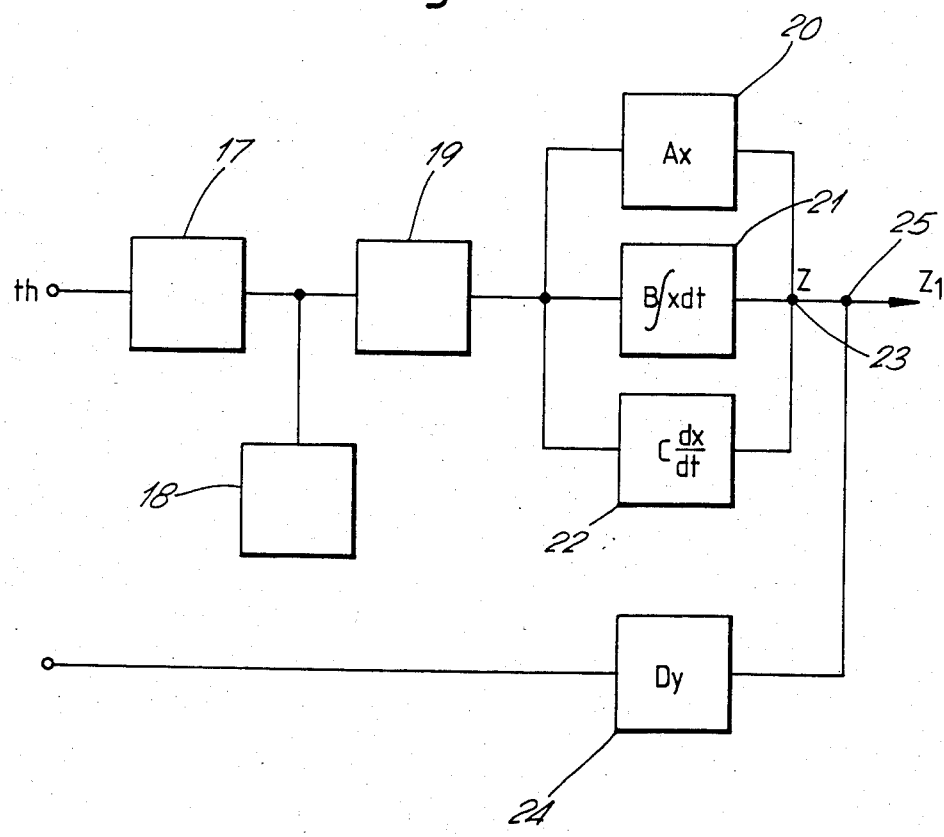
Figure 3:
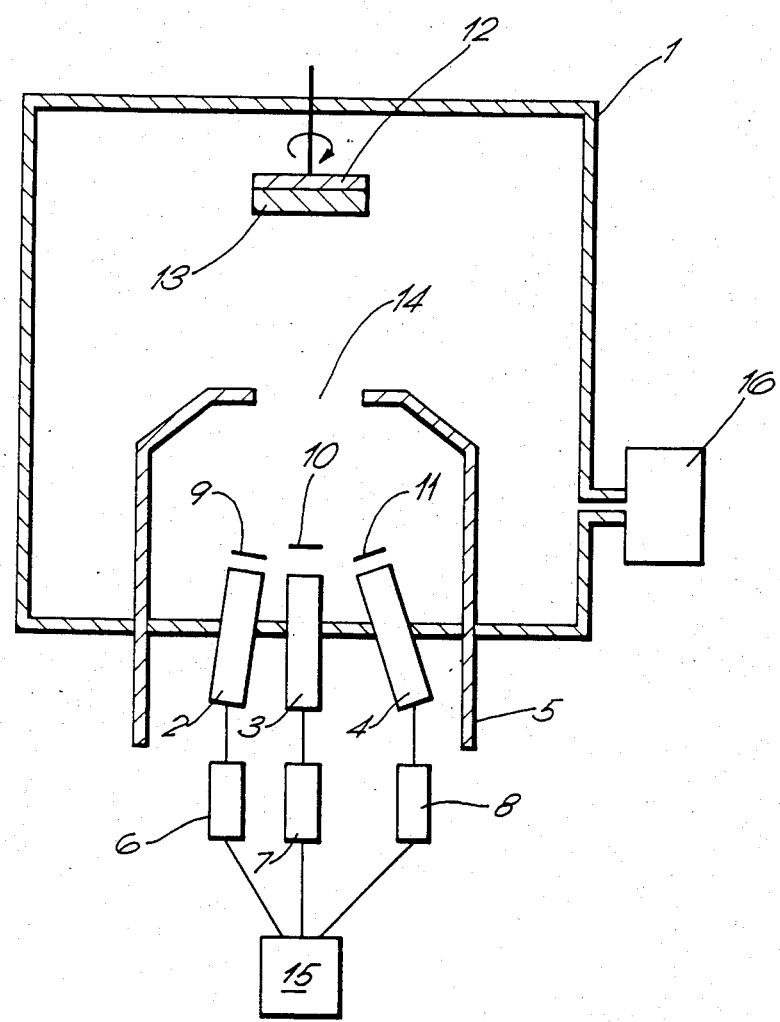

FIG. 2 is a graph similar to the FIG. 1 process, but relating to a $Ga_{1-x}Al_xAs$ layer grown by a process in which the source temperatures were controlled by a microcomputer using a programme containing a shutter term for each source, FIG. 3 is a schematic diagram of a molecular beam epitaxy growth apparatus used in a method according to the invention, and FIG. 4 is a schematic block diagram of a four-term power controller used to control the power input to an effusion cell in an MBE apparatus used in a method according to the invention.

FIG. 1 is a graph in which the aluminium concentration of a $GaAs/Al_xGa_{1-x}As$ heterostructure is plotted against the depth d from the surface of the film. The temperatures of the Ga, Al and As sources in the MBE apparatus used to grow this structure were controlled by three-term controllers. The growth rate of GaAs was about 1 $\mu$m/hour and the growth rate of $Al_xGa_{1-x}As$ was about 1.25 $\mu$m/hour. Upon opening the aluminium source shutter, the aluminium concentration increased to about $4.3 \times 10^{21}$ atoms/cm$^3$ corresponding to $x \approx 0.2$ and then decreased as the aluminium source temperature dropped. After about 12 minutes the aluminium concentration returned to its initial value but was never quite constant.

FIG. 2 is a graph showing the aluminium concentration of a $GaAs/Al_xGa_{1-x}As$ heterostructure grown using a four-term temperature controller. Upon opening the aluminium source shutter, the power to the aluminium cell was increased by about 1% which almost exactly equalled the increase in rate at which heat was lost by radiation as a result of removing the shutter from the front of the source. In this case the aluminium concentration increased to about $4.4 \times 10^{21}$ atoms/cm$^3$ corresponding to $x \approx 0.2$ and remained constant thereafter within experimental error. Because the balance between the rates of heat input and heat loss was constant in this case, no temperature fluctuation of the aluminium source occurred.

For both samples the aluminium concentration was determined by Secondary Ion Mass Spectrometry (SIMS). The absolute error in concentration is about $\pm 3\%$.

EXAMPLE

A molecular beam epitaxy apparatus shown in FIG. 3 comprises a vacuum chamber 1 containing effusion cells 2, 3 and 4 which served as sources for arsenic, gallium and aluminium respectively, which effusion cells 2, 3 and 4 are mounted within a shroud 5 cooled by liquid nitrogen. The effusion cells 2, 3 and 4 are each provided with heating elements (not shown) and the rates of input of heat to the heating elements of the respective effusion cells are controlled by means of respective three-term controllers 6, 7 and 8. Each effusion cell 2, 3 and 4 is provided with a respective mechanical shutter 9, 10 and 11 which can be independently operated to emanate or cut-off a molecular beam of source material from the respective effusion cell. A rotatable substrate holder 12 bearing a monocrystalline substrate 13 is located symmetrically with respect to a circular aperture 14 in the shroud 5. The three-term controllers are programmed by a microcomputer 15.

In order to determine the increase in power input to the heater of a given effusion cell when the shutter associated is opened, the effusion cell is allowed to stabilise with the shutter closed and the power input to the heater is noted. The shutter is then opened, and the cell is again allowed to stabilise. The new power input is noted, the difference between these power inputs is the increase in power input which is supplied to the heater while the shutter is open. This difference for the aluminium effusion cell was found to be about 1% of the original power input.

The vacuum chamber 1 was exhausted by means of a pump system 16. The effusion cells 2, 3 and 4 had been loaded with arsenic, gallium and aluminium respectively, and were heated to 370° C., 980° C. and 1050° C. respectively, in order to produce desired fluxes, each of the shutters 9, 10 and 11 being closed at this stage. A GaAs monocrystalline substrate 13 was heated to 650° C., and the shutter 9 was opened so that the substrate 13 was exposed to an $As_2$ flux of $2 \times 10^{15}$ mols/cm$^2$/sec. for 20 minutes. When the shutter 9 was opened, the microcomputer 15 increased the heat input of the effusion cell 2 heater by a power P in order to maintain the temperature of the cell 2 substantiallly constant. The temperature of the substrate 13 was then reduced to 600° C. and shutter 10 was opened so that the substrate 13 was exposed to a gallium flux of $6 \times 10^{14}$ mols/cm$^2$/sec., in order to grow a gallium arsenide layer. After 15 minutes growth, during which time 0.25 μm thickness of gallium arsenide had been grown, the substrate temperature was then raised to 700° C. Shutter 11 was then opened resulting in an aluminium flux of $1.5 \times 10^{14}$ mols/cm$^2$/sec. of aluminium being incident on the substrate 13. A 1 μm thick layer of gallium aluminium arsenide was grown in 48 minutes, and the shutters 10 and 11 were shut. The temperature of the substrate 13 was reduced to below 400° C. and the shutter 9 was then closed. When any of the shutters 9, 10 or 11 were opened, the heat input to the heater of the associated effusion cell was increased so as to maintain a significantly constant temperature of that effusion cell. When one of these shutters was closed, the heat input reverted to the value supplied to the effusion cell heater before the shutter was opened.

FIG. 2 shows the variation of the aluminium concentration with thickness of part of a GaAs/GaAlAs heterostructure device grown in the MBE apparatus described with reference to FIG. 3. It will be seen that FIG. 2 differs from FIG. 1 in that the aluminium content did not fall immediately after the peak value of about $4 \times 10^{21}$ atoms/cm$^3$ ($x \approx 0.2$) had been reached.

Instead of using a microcomputer to control the temperatures of the effusion cells, the power input to each effusion cell may be controlled by a respective four-power controller. FIG. 4 is a schematic block diagram of such a four-term controller which has been made by modifying an Oxford Instruments three-term controller DTC-2. An input signal th from a thermocouple (not shown) fitted to an effusion cell is converted into a signal proportional to temperature by a signal conductioning amplifier 17. The converted signal is compared with a reference signal generated by a controlled source 18 in order to generate a difference signal x which is proportional to $(T_s - T_m)$, where $T_s$ is the desired preset temperature of the effusion cell and $T_m$ is the measured temperature of the cell. After amplification in block 19, three signals are generated by blocks 20, 21 and 22, namely a proportional component Ax, an integral term B xdt and a differential action term Cdx/dt. These three signals are added togive a conventional three-term (PID) controller output z at point 23. A fourth term Dy is generated by a block 24, y having a value of zero when the effusion cell shutter is closed and a value of 1 when this shutter is open. This fourth term is added to the signal z at point 25 so as to produce an output signal $z_1$ which is defined by the relationship.

$$z_1 = Ax + B \int xdt + Cdx/dt + Dy$$

The signal $z_1$ is fed to an amplifier (not shown) which supplies a power P to the effusion cell heater, which power P is proportional to the signal $z_1$. The shutters are controlled electro-pneumatically, and a simple link is provided between the shutter control and the block 24 which generates the Dy term.

I claim:

1. In a method of manufacturing a semiconductor device, the method comprising the steps of providing a monocrystalline substrate in a deposition chamber of a molecular beam epitaxy apparatus, reducing pressure in the deposition chamber to below atmospheric pressure, heating the substrate, causing a plurality of successive combinations of molecular beams to be indicident on the substrate so as to form a plurality of epitaxial layers, wherein the molecular beams each comprise a constituent element of the respective layer material and each beam emanates from a separate source when a shutter associated with the respective source has been opened, the improvement comprising the steps of increasing the rate of input of heat to that source when the shutter of that source is opened, said increase being of a predetermined value so that the temperature of that source does not change substantially as a result of the opening of the shutter, and reducing the rate of input of heat to that source when the said shutter is closed, said reduction being of said predetermined value.

2. A method as claimed in claim 1, wherein said plurality of epitaxial layers constitute a superlattice structure.

3. A method as claimed in claim 1, wherein the semiconductor device is a double heterojunction laser diode.

4. A method as claimed in claims 3 - 4, wherein the rate of input of heat to a source is controlled by a four function controller in which the fourth function is linked to means controlling the opening and closing of the shutter associated with that source, and the fourth function produces the predetermined increase in rate of input of heat to the source.

5. A method as claimed in any of claims 1 to 3, wherein said rate of input of heat to each source and the opening and closing of the shuttes are controlled by means of a microprocessor or a microcomputer.

* * * * *